(12) United States Patent
Youssef

(10) Patent No.: US 6,909,313 B2
(45) Date of Patent: Jun. 21, 2005

(54) CIRCUIT AND METHOD FOR DETECTING THE STATE OF A SWITCH WITH REDUCED POWER

(75) Inventor: Tom Youssef, Dallas, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 352 days.

(21) Appl. No.: 10/147,639

(22) Filed: May 17, 2002

(65) Prior Publication Data

US 2003/0169091 A1 Sep. 11, 2003

Related U.S. Application Data

(63) Continuation-in-part of application No. 10/094,165, filed on Mar. 8, 2002.

(51) Int. Cl.⁷ .............................. H03L 7/06; H02B 1/24
(52) U.S. Cl. ..................... 327/147; 327/530; 340/479; 307/116
(58) Field of Search ................................ 307/112, 116, 307/108, 110, 130; 327/115, 147, 154, 374, 108, 530; 710/260, 303, 308, 320; 340/479, 644, 870.2; 713/300, 322, 601, 324

(56) References Cited

U.S. PATENT DOCUMENTS 4,051,421 A * 9/1977 Brinner et al. .............. 318/367
4,658,241 A * 4/1987 Torre ........................... 340/551
5,025,419 A * 6/1991 Nishino ....................... 365/221
5,841,644 A * 11/1998 Lipo et al. ..................... 363/37

OTHER PUBLICATIONS

U.S. Appl. No. 10/094,165, filed Mar. 8, 2002, Rong Yin, Tom Youssef, and David McClure.

* cited by examiner

Primary Examiner—Rajnikant B. Patel
(74) Attorney, Agent, or Firm—Lisa K. Jorgenson; Andre Szuwalski

(57) ABSTRACT

A circuit and method are disclosed for detecting activation of a switch, such as a mechanical switch, having a first terminal coupled to two or more voltage sources, with each voltage source providing a distinct voltage level representing a logic high level. The circuit includes first circuitry, having an output coupled to the switch for initially placing a first voltage across the switch representative of a logic low level. The circuit further includes second circuitry having an input coupled to the switch for sensing a voltage differential appearing across the switch and an output for indicating whether the voltage appearing across the switch is at any voltage representative of the logic high level, the second circuitry being controlled to selectively eliminate static current drawn by the circuit based upon the value of the output of the second circuitry.

29 Claims, 5 Drawing Sheets

CIRCUIT AND METHOD FOR DETECTING THE STATE OF A SWITCH WITH REDUCED POWER

CROSS REFERENCE TO PENDING APPLICATION

The present application is a continuation-in-part application of patent application Ser. No. 10/094,165, filed Mar. 8, 2002 currently pending.

BACKGROUND OF THE INVENTION

1. Technical Field of the Invention

The present invention relates to detecting the state of an electrical device, and particularly to a lower power circuit and method for detecting whether a switch is closed.

2. Description of the Related Art

Techniques exist for monitoring the condition of mechanical devices and detecting whether the mechanical devices have been tampered with or otherwise physically changed. For instance, existing security systems are known to electronically monitor the state of mechanical or magnetic switches disposed about a building in order to determine whether such switches change from an open state to a closed state or vice versa. In many instances, such security systems are not implemented in an efficient or reliable manner. Some existing security systems are bulky and consume a relatively sizeable amount of power.

What is needed is a circuit and method for reliably detecting the state of a device, such as a mechanical switch, that may be simply and inexpensively implemented in an electronics system with little circuit overhead.

SUMMARY OF THE INVENTION

Embodiments of the present invention overcome shortcomings in prior detection circuits and satisfy a significant need for a relatively low power detection circuit for detecting whether a switch, such as a mechanical switch, has changed state. The switch may be coupled to two or more voltage sources, with each voltage source being capable of providing to the switch a distinct voltage level representative of a logic high value.

According to a first embodiment of the present invention, the detection circuit may initially provide a predetermined voltage differential, such as a near zero voltage differential, across the terminals of the switch. The detection circuit may provide the predetermined voltage differential for a predetermined period of time and thereafter relatively weak drive a terminal of the switch so as to maintain the predetermined voltage differential. The detection circuit may sense whether the switch has been closed by sensing whether the voltage differential appearing across the switch approaching a voltage level representative of a logic high value and, in response, drive an output signal of the circuit to a value indicative of the switch being closed. The detection circuit may also, in response to a determination that the switch has been closed, substantially eliminate static current dissipation in the circuit. In this way, the detection circuit may be utilized in conjunction with voltage sources, such as a battery in a battery back-up mode, which generate voltage levels representative of a logic high value but nonetheless may otherwise potentially cause the detection circuit to dissipate a relatively high amount of current/power.

BRIEF DESCRIPTION OF THE DRAWINGS

A more complete understanding of the system and method of the present invention may be obtained by reference to the following Detailed Description when taken in conjunction with the accompanying Drawings wherein.

DETAILED DESCRIPTION OF THE EXEMPLARY EMBODIMENTS

The present invention will now be described more fully hereinafter with reference to the accompanying drawings in which exemplary embodiments of the invention are shown. This invention may, however, be embodied in many different forms and should not be construed as being limited to the embodiments set forth herein. Rather, the embodiments are provided so that this disclosure will be thorough and complete, and will fully convey the scope of the invention to those skilled in the art.

Figure 1:
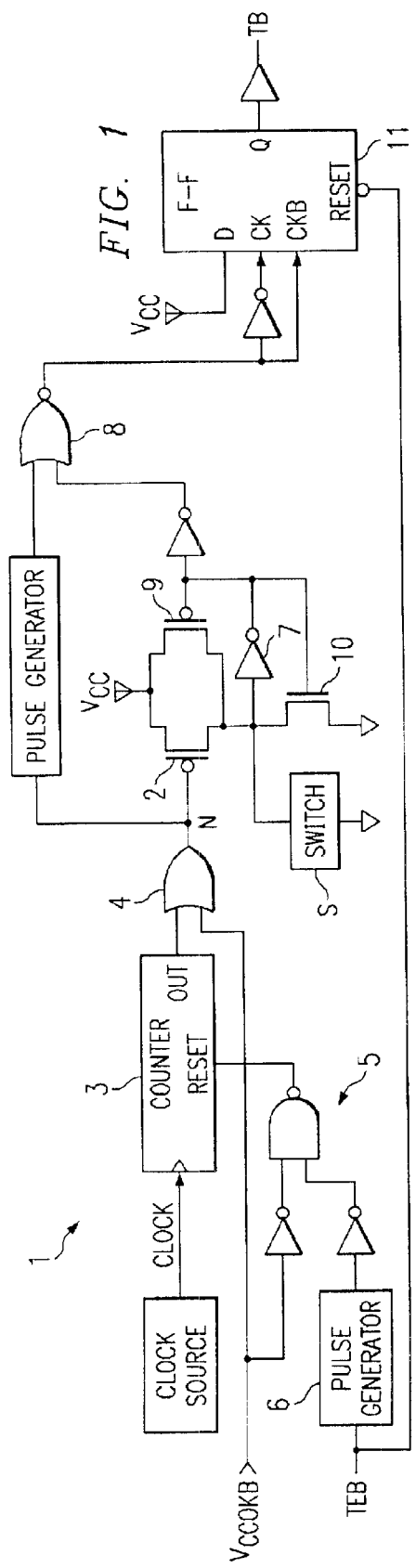
FIG. 1 is a circuit diagram of a detection circuit according to a first embodiment of the present invention.

Referring to FIG. 1, there is shown a detection circuit 1 for detecting a change in the electrical state of a switch S, such as a mechanical switch, according to a first exemplary embodiment of the present invention. In general terms, detection circuit 1 is capable of detecting whether switch S has been closed and generating a signal having a value indicative of the detection.

In order to detect a change in the electrical state of switch S, a voltage may be initially applied across the terminals of switch S and the voltage thereafter monitored to detect a change in the initially-applied voltage. Accordingly, detection circuit 1 may include drive circuitry that temporarily drives the voltage across switch S to a non-zero voltage level. The non-zero voltage may be, for example, the voltage difference between a logic high reference voltage level and a logic low reference voltage level. Switch S may be driven to the non-zero voltage level for a predetermined period of time. The drive circuitry may include a first transistor 2 which couples a first terminal of the switch S to a reference voltage level. In the event a second terminal of switch S is coupled to a logic low reference voltage level, such as the ground reference, transistor 2 may couple the first terminal of switch S to the logic high reference voltage level, such as Vcc. Alternatively, first transistor 2 may couple the first terminal of switch S to the logic low reference voltage level in the event the second terminal of switch S is coupled to a logic high reference voltage level.

The drive circuitry of detection circuit 1 may temporarily activate first transistor 2 for a predetermined period of time. Accordingly, the drive circuitry of detection circuit 1 may include a counter 3 that is activated or otherwise enabled to count so as to control the predetermined period of time that first transistor 2 is activated. For instance, counter 3 may receive, at a clock input thereof, a clock signal from a clock source, such as a clock signal from a ring oscillator circuit, and a control signal connected to a reset input of counter 3. An output of counter 3 may be coupled to the control terminal of first transistor 2 via a logic gate 4, such as a logic OR gate. In this way, the output signal of counter 3 may allow first transistor 2 to be activated during the time counter 3 counts clock pulses generated by the clock source, and cause first transistor 2 to be deactivated after a predetermined number of clock pulses have been counted.

Counter 3 may be activated or enabled from any of a plurality of sources. For instance, counter 3 may be activated upon completion of a power-up routine for the integrated circuit with which detection circuit 1 may be associated. The drive circuitry of detection circuit 1 may include logic circuitry 5 coupling a power-up signal Vccokb to the reset input of counter 3. In this way, when signal Vccokb transitions from an initial logic one state (during the power-up routine) to a logic low state, counter 3 transitions from a reset state to an operational state for counting clock pulses.

In addition, counter 3 may be reset upon an enable signal TEB transitioning to a logic low state. A pulse generator circuit 6 may receive enable signal TEB and generate a pulse on an output signal of pulse generator circuit 6. The pulse signal passes through logic circuitry 5 to briefly reset counter 5. Thereafter, counter 5 is enabled to count a predetermined number of clock pulses.

Detection circuit 1 may further include sense circuitry for sensing switch S being activated and/or closed. In this case, the sense circuitry detects the voltage differential appearing across switch S dropping from a non-zero voltage level (as initially applied by the drive circuitry) to a voltage level approximately at zero volts. The sense circuitry may include a trigger circuit 7, such as a logic inverter gate, connected to the first terminal of switch S and which generates a logic one level following the voltage appearing on the first terminal of switch S falling to approximately zero volts. Logic circuitry 8 may receive the output of trigger circuit 7 and generate a signal that is indicative of switch S being activated.

The sense circuitry of detection circuit 1 may further relatively weakly maintain or latch the voltage appearing on the first terminal of switch S. In this regard, the sense circuitry may include pull-up transistor 9 and pull-down transistor 10 which maintain the first terminal of switch S at or near a voltage level to which the node was most recently driven. In particular, pull-up transistor 9 and pull-down transistor 10 may combine with trigger circuit 7 to form latch elements to maintain a voltage level on the first terminal of switch S to which the first terminal was driven, in the event the first terminal is no longer driven and would otherwise "float". Pull-up transistor 9 and pull-down transistor 10 may be "weak" transistors in that the first terminal of switch S may be easily driven to a different voltage level by first transistor 2 or switch S itself.

Detection circuit 1 may further include a sequential logic circuit to maintain or store a logic value that indicates whether or not switch S is detected in the closed position. The sequential logic circuit may include a flip flop circuit 11, such as a D-type flip flop. Flip flop circuit 11 may have one or more clock inputs coupled to the output of logic circuitry 8 and a data input coupled to a high logic level (Vcc) so that when the output of logic circuitry 8 transitions from a logic high level to a logic low level in response to switch S being closed, flip flop circuit 11 stores a logic high value. A reset input of flip flop circuit 11 may be coupled to enable signal TEB so that flip flop circuit 11 may be initially reset (i.e., store a logic low value) indicative of switch S being open.

It is understood that flip flop circuit 11 may be formed of different flip flop circuits, clocked by a different edge of the output of logic circuitry 8, have a data input coupled to a logic low voltage level (ground) and/or initialized to a different logic value while still being capable of storing a logic value that indicates whether or not switch S has been closed.

Detection circuit 1 may include circuitry which detects and records in flip flop circuit 11 switch S being closed even when first transistor 2 is activated to initialize the voltage appearing on the first terminal of switch S to logic high levels. In particular, switch S may be closed prior to detection circuit 1 being powered. Consequently, the first terminal of switch S will not transition from a logic high level to a logic low level and thereby cause flip flop circuit 11 to store a logic high value indicative of switch S being closed. To allow flip flop circuit 11 to store a logic high value in this situation, detection circuit 1 may include a pulse generator circuit 12 having an input coupled to the control terminal of first transistor 2 and an output coupled to a second input of logic circuitry 8. In this way, when first transistor 2 is being turned off (i.e., the control terminal thereof transitioning from a logic low level to a logic high level), a pulse is generated by pulse generator circuit that causes flip flop circuit 11 to store a logic high value. As can be seen, logic circuitry 8 will prevent flip flop circuit 11 from storing a logic high value when switch S is open.

Figure 2:
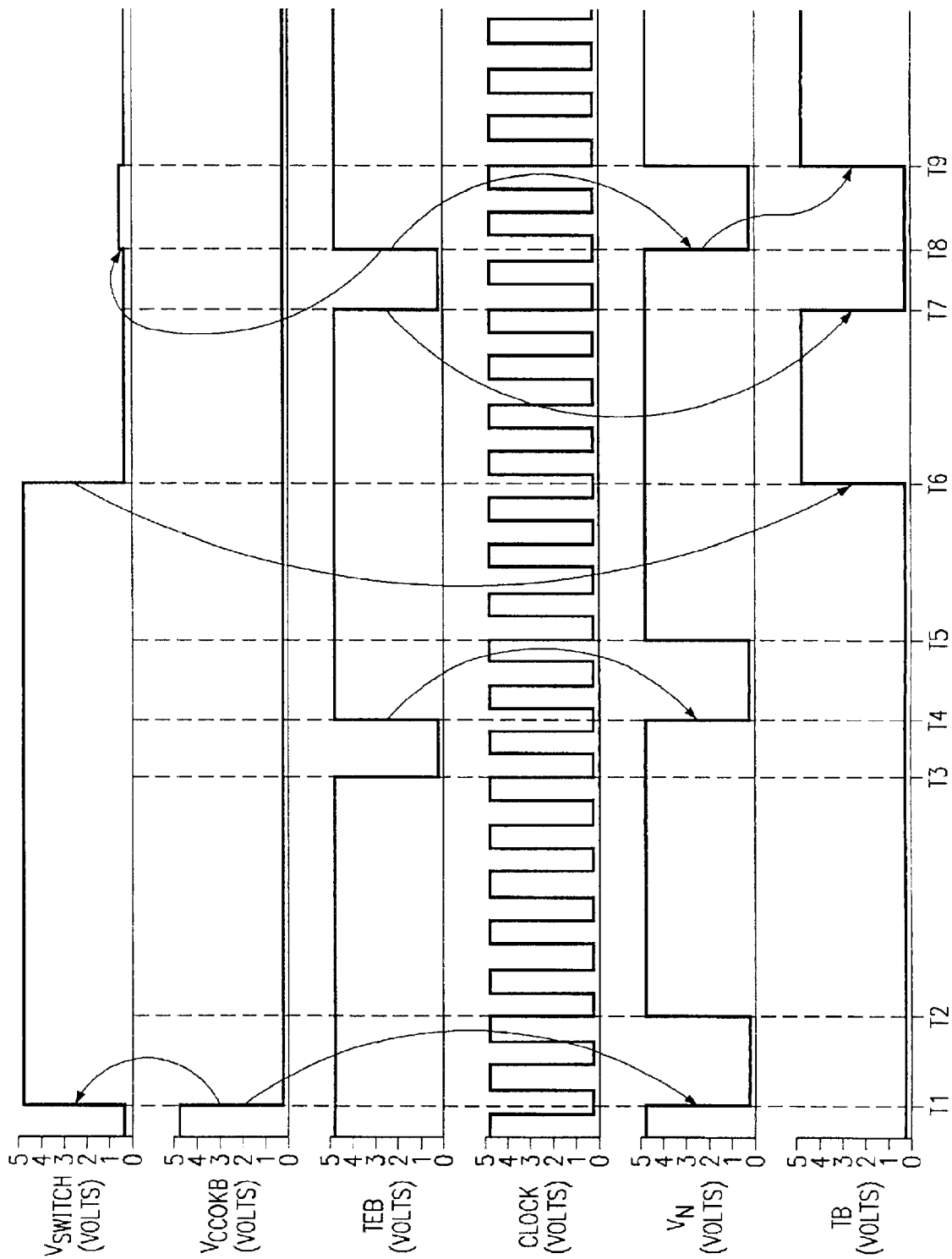
FIG. 2 is a timing diagram illustrating an operation of the detection circuit shown in FIG. 1.

The operation of detection circuit 1 will be described with respect to the timing diagram of FIG. 2. Initially, it is assumed that switch S is open. During power-up, signal Vccokb and enable signal TEB are at a logic high value. Counter 3 is reset and unable to count the pulses appearing on its clock input. At the completion of the power-up operation, which is performed external to detection circuit 1, signal Vccokb transitions to a logic low level at time t1. This transition activates first transistor 2 so as to charge the first terminal of switch S towards a logic high value. Once the voltage on first terminal of switch S reaches a logic high level, trigger circuit 7 is caused to output a logic low level which thereupon activates pull-up transistor 9 (and deactivates pull-down transistor 10) to charge the first terminal of switch S. The transition appearing on signal Vccokb also causes the reset input of counter 3 to be driven to a logic low level, which activates counter 3 and allows it to begin counting clock pulses. When counter 3 counts a predetermined number of clock pulses, the output signal of counter 3 transitions from a low logic level to a high logic level at time t2, which turns off first transistor 2. However, the voltage appearing on the first terminal of switch S remains at a logic high level due to the activation of pull-up transistor 9. Counter 3 stops counting and the output thereof remains at a logic high value.

At time t3, enable signal TEB transitions to a low logic level. This transition resets flip flop circuit 11 so that output signal TB is driven to a logic low level. When enable signal TEB transitions to a logic high level at time t4, counter 3 is caused to be temporarily reset, which drives the output of counter 3 to a logic low level and thereby reactivates first transistor 2. When counter 3 counts a predetermined number of clock pulses, the output signal of counter 3 transitions from a low logic level to a high logic level at time t5, which turns off first transistor 2. However, the voltage appearing on the first terminal of switch S remains at a logic high level due to the activation of pull-up transistor 9. Counter 3 stops counting and the output thereof remains at a logic high value.

At this point, detection circuit 1 is ready to detect whether switch S is closed.

Due to some activity external to detection circuit 1, switch S is closed at time t6. This causes the first terminal of switch S, which was previously at a logic high level, to be driven to a logic low level. When the first terminal of switch S is at a low logic level, the output of trigger circuit 7 transitions to a logic high level, which activates pull-down transistor 10 and deactivate pull-up transistor 9. In addition, the output of logic circuitry 8 is caused by trigger circuit 7 to transition from a logic high level to a logic low level, which causes flip flop circuit 11 to load and store a logic high level. The output of flip flop circuit 11 is driven to a logic high level to indicate that switch S is closed.

At time t7, enable signal TEB may transition to a low logic level while switch S remains closed. As with time t3, this transition resets flip flop circuit 11 so that output signal TB is driven to back a logic low level. When enable signal TEB transitions to a logic high level at time t8, counter 3 is caused to be temporarily reset, which drives the output of counter 3 to a logic low level and thereby reactivate first transistor 2 to attempt to charge the first terminal of switch S. However, switch S maintains the first terminal thereof at a logic low level. When counter 3 counts a predetermined number of clock pulses, the output signal of counter 3 transitions from a low logic level to a high logic level at time t9, which turns off first transistor 2. With the output of trigger circuit 7 being at a logic high level, the transition appearing on the control terminal of first transistor 2 causes a pulse that propagates through logic circuitry 8 so as to cause flip flop circuit 11 to store a logic high level. Output signal TB thereupon transitions back to a high logic level representative of switch S being in the closed position. In this way, an attempt to initialize conditions to monitor switch S during the time switch S is closed will still cause detection circuit 1 to detect switch S being closed.

Figure 3:
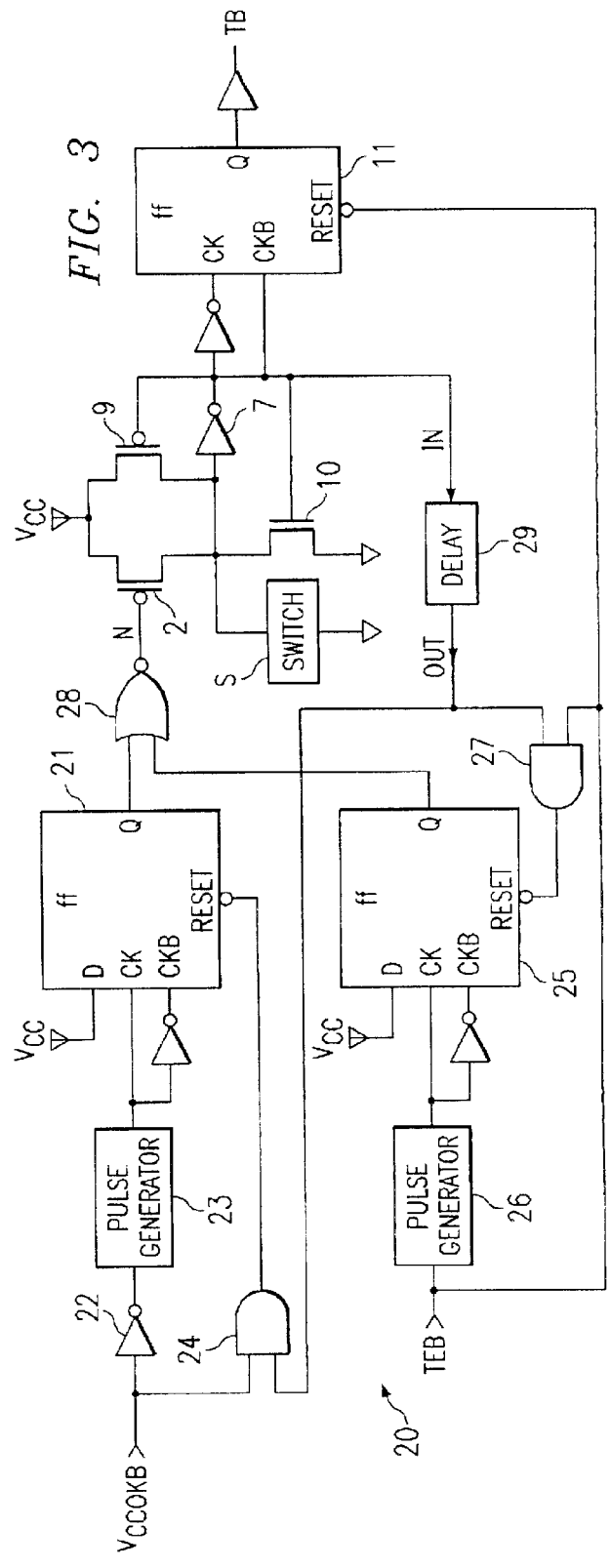
FIG. 3 is a circuit diagram of a detection circuit according to a second embodiment of the present invention.

Referring to FIG. 3, there is shown a detection circuit 20 according to a second exemplary embodiment of the present invention. Instead of using a counter 3 to limit the period of time first transistor 2 is activated, detection circuit 20 uses feedback from the output of trigger circuit 7. Specifically, input signal Vccokb is coupled to the clock inputs of flip flop circuit 21 via logic inverter 22 and pulse generator circuit 23. The data input of flip flop circuit 21 is tied to a high logic level, and the reset input of flip flop circuit 21 is coupled to input signal Tccokb via logic AND gate 24. Similarly, input enable signal TEB is coupled to the clock inputs of flip flop circuit 25 via pulse generator circuit 26. The data input of flip flop circuit 25 is tied to a high logic level, and the reset input of flip flop circuit 25 is coupled to input enable signal TEB via logic AND gate 27. The output of flip flop circuits 21 and 25 drive a logic NOR gate 28, the output of which is coupled to the control terminal of first transistor 2. Feedback is provided with delay circuit 29, which includes an input coupled to the output of trigger circuit 7 and an output coupled to the input of logic AND gates 24 and 27.

It is understood that other flip flop circuits and logic circuitry may be used to implement detection circuit 20 without departing from the operation thereof.

Upon the completion of the power-up routine, input signal Vccokb transitions from a logic high level to a logic low level. This transition causes flip flop circuit 21 to load and store a logic high value, which thereupon activates first transistor 2 to charge the terminal of switch S. When the first terminal of switch S reaches a logic high voltage level, the output of trigger circuit 7 is driven low. Following the predetermined period of time corresponding to the delay of delay circuit 29, flip flop circuits 21 and 25 are reset, which causes first transistor 2 to be deactivated. A similar set of events occurs when input enable signal TEB transitions from a low logic level to a high logic level.

When switch S is closed, the output of trigger circuit 7 transitions from a low logic level to a high logic level, which causes flip flop circuit 11 to load and store a logic high value. Thereafter, output signal TB is driven to a logic high value to indicate that switch S is closed.

In some applications, a switch S1 may be coupled to one or more voltage supply sources, each of which provides a distinct voltage level representing a logic high level to switch S1. For example, the switch S1 may be employed in a device having a power supply source and a battery for use in a battery back-up condition (in which the power supply source does not perform as desired and the battery supplies current to a device). In the battery back-up condition, the back-up battery may provide voltage and current levels that are reduced relative to the voltage and current levels, respectively, provided by the power supply source, but nevertheless allow for a certain level of device functionality and/or performance. As can be understood, a detection circuit employed in this environment may be expected to be able to relatively efficiently function and/or perform during both a normal condition (in which the device and/or circuit is powered by the power supply source) and the battery back-up condition.

Figure 4:
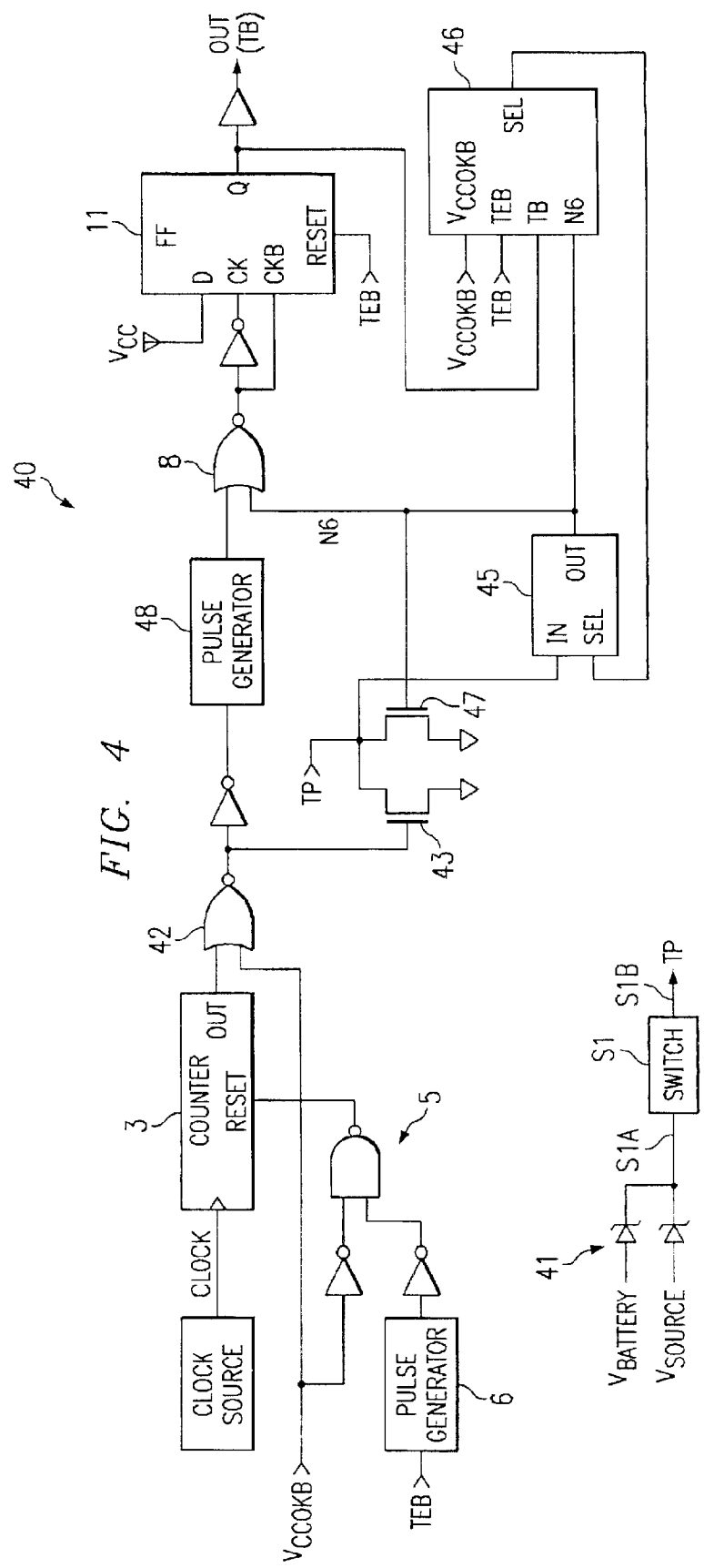
FIG. 4 is a circuit diagram of a detection circuit according to a third embodiment of the present invention.

With reference to FIG. 4, there is shown a detection circuit 40 according to another embodiment of the present invention. Detection circuit 40 is based upon the detection circuit 1 of FIG. 1, but has the additional advantage of dissipating less current/power when switch S1 is closed, especially during a battery back-up condition. Detection circuit 40 may include a number of circuits found in detection circuit 1 of FIG. 1, such as counter 3, logic circuitry 5, pulse generator 6 and flip flop circuit 11. Counter 3, logic circuitry 5, pulse generator 6 and flip flop circuit 11 function/perform as described above with respect to FIG. 1.

Switch S1 may be coupled at a first terminal thereof to both a power supply source (denoted by Vsource) and a back-up battery (denoted by Vbattery). Each of the power supply source Vsource and the back-up battery Vbattery may be coupled to switch S1 via a diode 41. In this way, switch S1 will have a voltage appearing at one of its terminals S1A that is the greater voltage of Vsource and Vbattery, less a voltage drop of the diode 41.

Detection circuit 40 may utilize input signal Vccokb, enable signal TEB, counter 3, logic circuitry 5, and pulse generator 6 as described above to initially and temporarily drive terminal S1B of switch S1 to a ground potential. In particular, detection circuit 40 may include a logic NOR gate 42 having a first input coupled to the output of counter 3 and a second input coupled to input signal Vccokb. In addition, detection circuit 40 may include a pull-down transistor 43 coupled between terminal S1B and the ground potential and having a control terminal coupled to the output of logic NOR gate 42. In this way, a pulse signal may be generated using counter 3 that is applied to pull-down transistor 43 to temporarily activate pull-down transistor 43 and pull terminal S1B of switch S1 to a ground potential as a result.

Detection circuit 40 may further include a circuit 45 having an input coupled to terminal S1B of switch S1 and capable of generating an output having a value based upon the voltage appearing on terminal S1B of switch S1. Specifically, circuit 45 may perform a logical inversion function with hysteresis between its input and output. Unlike logic inverter 7 of detection circuit 1 (FIG. 1), however, circuit 45 may include a select input to selectively eliminate the possibility of static current being drawn by circuit 45 in the event a relatively lower voltage than the Vsource, such as the voltage Vbattery provided by a battery, appears on terminal S1B of switch S1.

Figures 5, 6:
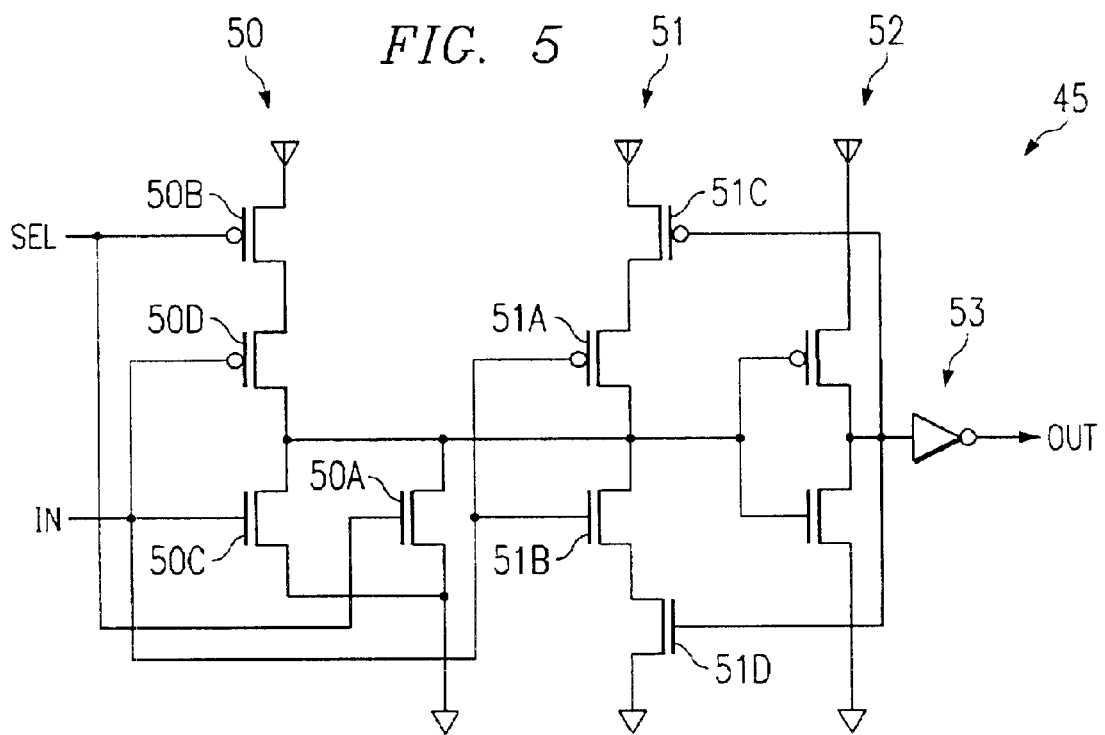
FIG. 5 is a circuit diagram of a buffer circuit utilized in the detection circuit of FIG. 4.
FIG. 6 is a circuit diagram of a control/enabling circuit utilized in the detection circuit of FIG. 4.

An implementation of circuit 45, according to an embodiment of the present invention, is shown in FIG. 5. As stated above, circuit 45 of FIG. 5 provides a hysteresis effect between input IN and output OUT. Circuit 45 may include a first stage 50, a second stage 51, a third stage 52 and a fourth stage 53. Transistors in first stage 50 may be configured to perform a logic NOR function between input IN and select input SEL. Second stage 51 may include four transistors 51A–51D series-connected to each other, with two p-channel transistors 51A and 51C and two n-channel transistors 51B and 51D. Input IN may be connected to the gate/control terminal of transistors 51A and 51B. The gate/control terminal of transistors 51C and 51D may be connected to the output of third stage 52. Third stage 52 and fourth stage 53 may each be logic inverters, with the input of third stage 52 being connected to input IN and the input of fourth stage 53 being connected to the output of third stage 52. The above-mentioned hysteresis effect is provided by employment of second stage 51 in circuit 45.

As can be seen, when select input SEL is at a logic low level, circuit 45 performs as a logic inverter with hysteresis in that output OUT is the logical inversion of input IN. However, when select input SEL is at a logic high level, the output of first stage 50 is pulled to the ground potential by transistor 50A and transistor 50B is turned off. In this way, no static current flows in first stage 50 due to transistor 50B being turned off, even if input IN is at a voltage level to simultaneously activate/turn on transistors 50C and 50D. Output OUT is driven to a logic low level when select input SEL is at a logic high level. In this way, select input SEL may serve to disable circuit 45 from providing at output OUT the logical inversion of input IN. It is noted that static current is unable to flow in second stage 51 even if input IN is at a voltage level to simultaneously activate transistors 51A and 51B, due to only one of transistors 51C and 51D being activated at a time.

Detection circuit 40 may further include a transistor 47 coupled between terminal S1B of switch S1 and the ground potential and having a control/gate terminal coupled to the output of circuit 45. Transistor 47 may be sized to relatively weakly pull terminal S1B of switch S1 to the ground potential when activated.

As mentioned above, detection circuit 40 may include flip flop circuit 11. Flip flop circuit 11 may be a D-type flip flop circuit (as shown in FIG. 4), but it is understood that flip flop circuit 11 may be other types of flip flop circuits. A data input of flip flop circuit 11 may be coupled to a logic high level, and a reset input of flip flop circuit 11 may be coupled to enable signal TEB. The clock input CK and the inverted clock input CKB may be coupled to the output of circuit 45 via logic NOR gate 8. In particular, flip flop circuit 11 will store a logic high value upon the output OUT of circuit 45 transitioning from a logic high level to a logic low level (i.e., a falling edge of output OUT of circuit 45).

Detection circuit 40 may further include a control circuit 46 that generates the control signal for driving the select input SEL of circuit 45. Control circuit 46 may generate the control signal based upon a number of signals/conditions of detection circuit 40 and/or the device in which detection circuit 40 is employed. For instance, the control signal generated by control circuit 46 may be based upon the output of flip flop circuit 11, the output OUT of circuit 45, input signal Vccokb and/or enable input signal TEB.

FIG. 6 illustrates a circuit implementation of control circuit 46 in accordance with an exemplary embodiment of the 5 present invention. A logic NAND gate 61 may receive as inputs the output of flip flop circuit 11 (denoted by input TB) and the logical inversion of the output OUT of circuit 45 (denoted by input n6). Another logic NAND gate 62 may receive as inputs the logical inversion of the output of flip flop circuit 11, input signal Vccokb and a delayed, logical inversion of the output OUT of circuit 45. Delay circuit 63, which may provide at its output a delayed version of the signal appearing on its input, may be utilized to delay the signal appearing on output OUT of circuit 45 (n6) from being applied to logic NAND gate 62. A logic NAND gate 64 may receive enable signal TEB and the output of logic NAND gates 61 and 62, and generate output signal SEL which is applied to the select input SEL of circuit 45. As can be understood, the output SEL of control circuit 46 will be in a logic low state (to enable circuit 45 to provide at output OUT thereof the logical inversion of input IN of circuit 45) when enable signal TEB and the outputs of logic NAND gates 61 and 62 are all in the logic high state, and will otherwise be in a logic high state (to disable circuit 45 from providing at output OUT thereof the logical inversion of input IN of circuit 45 while substantially eliminating static current drawn by circuit 45).

Figure 7:
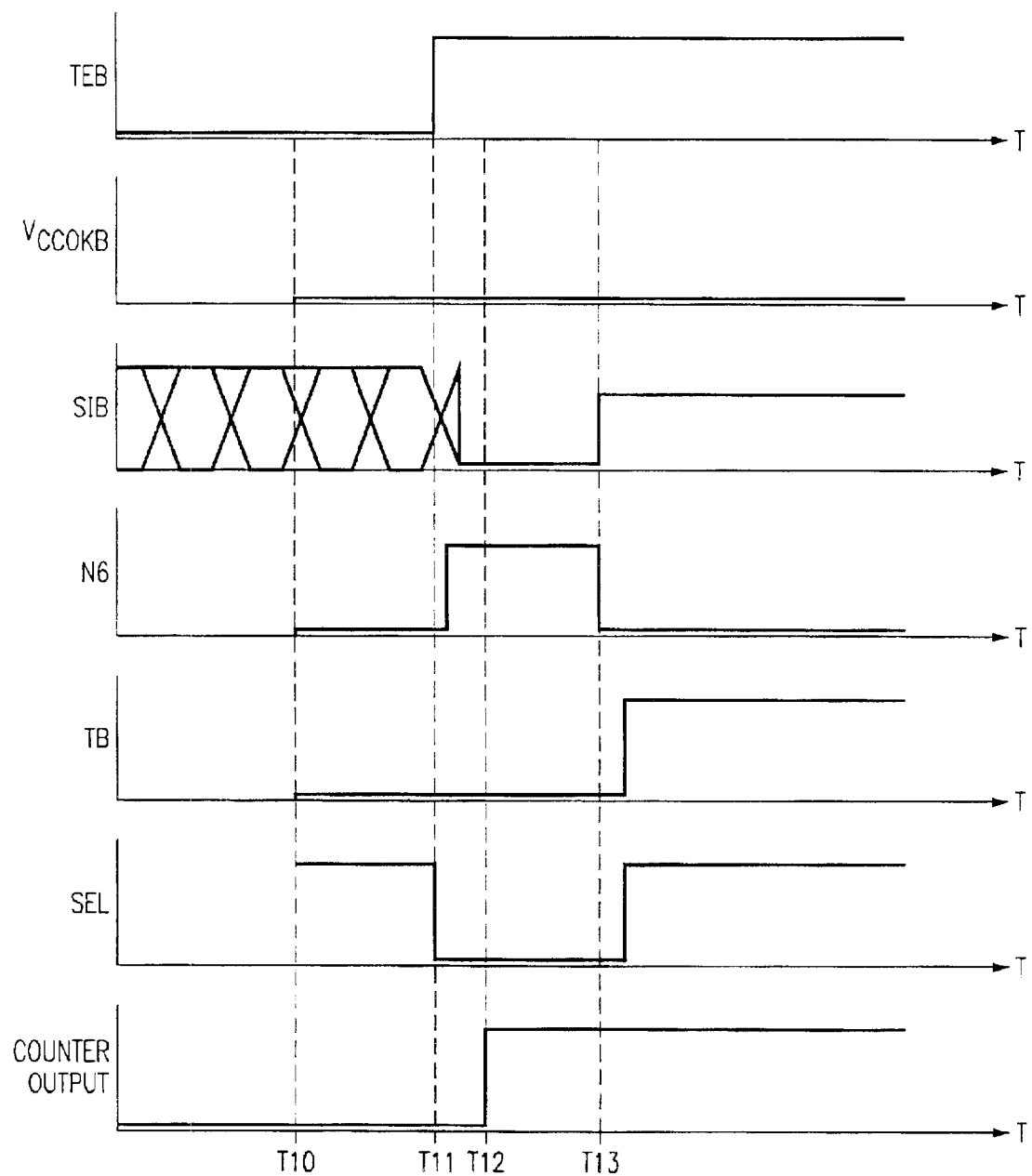
FIG. 7 is a timing diagram illustrating an operation of the detection circuit of FIG. 4.

The operation of detection circuit 40 will be described with reference to FIG. 7. It is assumed that input signal Vccokb is at a logic high level when a Vbattery is greater than Vsource (i.e., the battery back-up mode) and is at a logic low level when Vsource is greater than Vbattery (i.e., normal mode). Initially, it is assumed that switch S1 is open. Enable signal TEB may reset detection circuit 40 and otherwise prepare detection circuit 40 for monitoring the status of switch S1. When enable signal TEB is in a logic low level at time t10 flip flop circuit 11 is reset so that output signal TB is driven to a logic low state. With enable signal TEB being in the logic low state, output SEL of control circuit 46 is in the logic high state, which causes output signal OUT of circuit 45 (node n6) to be in the logic low state.

When enable signal TEB transitions to a logic high level at time t11 to complete the reset operation, a negative pulse is generated by pulse generator 6 so that counter 3 is caused to be temporarily reset. The output of counter 3 is driven to a logic low level. At this time, if input signal Vccokb is at a low logic level, the output of logic NAND gate 42 is at a logic high level which activates transistor 43. Activation of transistor 43 pulls terminal S1B of switch S1 to the ground potential. Following the occurrence of the pulse generated by pulse generator 6, counter 3 is enabled to and begins counting pulses appearing on clock signal CLK. When counter 3 has counted a predetermined number of clock pulses appearing on clock signal CLK, the output of counter 3 transitions to the logic high state at t12. This causes logic NAND gate 42 to be in the logic low state so that transistor 43 is deactivated and no longer pulls terminal S1B of switch S1 to the ground potential.

In addition, enable signal TEB being in the logic high state causes output SEL of control circuit 46 to be in the logic low state, due to the output of flip flop circuit 11 and signal Vccokb being in the logic low state. This causes transistor 50A and 50B of circuit 45 to be deactivated and activated, respectively. This and terminal S1B being pulled to ground cause output OUT of circuit 45 to be in the logic high state, which activates transistor 47 to relatively weakly maintain terminal S1B of switch S1 at the ground potential. At this point, detection circuit 40 is capable of monitoring the state of switch S1.

Due to some activity external to detection circuit 40, switch S1 is closed at time t13. This causes the terminal S1B of switch S1 to transition from the ground potential to a voltage level of the greater of Vsource (provided by an external power supply) and Vbattery (provided by a back-up battery), less the voltage drop across a diode 41. This transition to a greater voltage than the ground potential occurs despite the activation of transistor 47, due to transistor 47 having a relatively weak drive capability. The transition also activates transistor 50C of circuit 45 and causes output OUT thereof to transition from a logic high level to a logic low level. Output OUT being in the logic low level deactivates transistor 47 and causes flip flop circuit 11 to clock a logic high value, which causes output TB to be in the logic high state. Output TB being at a logic high level thereby indicates that switch S1 has been detected to be closed.

In the event that terminal S1B of switch S1 is not at a high enough voltage level to completely turn off/deactivate transistor 50D of circuit 45, a static current may flow through transistors 50B, 50D and 50C. A static current may undesirably increase the power dissipation of detection circuit 40 and may otherwise adversely affect the operation of the device in which detection circuit 40 is disposed. For instance, if switch S1 is coupled to a battery or a capacitor in order to power the device in which detection circuit 1 is located, static current may prematurely reduce the life expectancy of the battery or prematurely discharge the capacitor. As a result, control circuit 46 and circuit 45 are adapted to substantially eliminate the occurrence of static current flow in detection circuit 40. In particular, following output TB transitioning to the logic high state, the output of logic NAND gate 61 is driven to a logic low state, which causes output SEL of control circuit 46 to be in the logic high state. This deactivates transistor 50B of circuit 45 and activates transistor 50A thereof. With transistor 50B now being deactivated, a current path through transistors 50B and 50D is shut off so that no static current can flow in circuit 45.

In the event the device in which detection circuit 40 is used is in the battery back-up mode, input signal Vccokb is driven to a logic high level. Counter 3 is maintained in the reset state while input signal Vccokb is in the logic high state, due to logic circuitry 5. In addition, transistor 43 is deactivated and is therefore unable to pull terminal S1B of switch S1 to the logic low state. Logic NAND gate 62 of control circuit 46 is utilized in the battery back-up mode to cause output SEL to be driven to the logic high state when flip flop circuit 11 maintains a logic low value and the output OUT of circuit 45 is in the logic low state. When in the battery back-up mode, delay circuit 63 will prevent a race condition from occurring when the output OUT of circuit 45 transitions from a logic low to a logic high state and flip flop circuit 11 changes from a logic low state to a logic high state.

It is noted that in the event switch S1 is closed during the time signal TEB is at a logic low level during a reset operation, a positive pulse is generated at the output of pulse generator 48 following the output of logic NOR gate 42 transitioning from a logic high to logic low level (due to counter 3). The positive pulse causes flip flop circuit 11 to store a logic high value, thereby indicating the detection of switch S1 being in the closed state.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A circuit for detecting a state of a switch having a first terminal coupled to one or more voltage sources and a second terminal, each voltage source generating a distinct voltage level representing a first logic state, the circuit comprising:
   a first circuit for temporarily driving the second terminal of the switch in an open state to a voltage representing a second logic level;
   a second circuit, coupled to the switch, for sensing a voltage level of the second terminal of the switch and generating an output signal representative of the voltage sensed;
   a third circuit, coupled to the second circuit, for substantially eliminating static current drawn by the circuit when the switch is in a closed state; and
   a sequential logic circuit responsive to the output signal of the second circuit so as to maintain a logic value representative of the switch having been in a closed state.

2. The circuit of claim 1, wherein the third circuit comprises:
   logic circuitry having an input that is coupled to the output signal of the sequential logic circuit and an output coupled to an input of the second circuit.

3. The circuit of claim 2, wherein the logic circuitry includes a second input coupled to the output signal of the second circuit.

4. The circuit of claim 2, wherein the logic circuitry includes a second input for receiving a signal having a value indicative of the one or more voltage sources being a battery.

5. The circuit of claim 2, wherein the logic circuitry includes a second input for receiving a reset signal to reset the circuit.

6. The circuit of claim 1, wherein the second circuit comprises a buffer circuit having a first input coupled to the second terminal of the switch and a second input for receiving an enable signal.

7. The circuit of claim 6, wherein the buffer circuit includes a hysteresis effect.

8. The circuit of claim 6, wherein the second input of the second circuit is coupled to an output of the third circuit.

9. The circuit of claim 6, wherein the second circuit includes a first stage of transistors coupled to the first and second inputs of the second circuit, at least one transistor in the first stage has a control terminal coupled to the second input of the buffer circuit and disposed in the first stage so that when deactivated, the at least one transistor substantially eliminates any static current path in the first stage.

10. The circuit of claim 6, further comprising a transistor coupled between the second terminal of the switch and a voltage representative of the second logic level and having a control terminal coupled to the output signal of the second circuit, the transistor being adapted to relatively weakly pull the second terminal of the switch to the voltage representative of the second logic level.

11. The circuit of claim 1, wherein the first circuit comprises a counter for defining a period of time during which the second terminal of the switch is driven to the voltage representing the second logic level.

12. The circuit of claim 11, wherein the counter generates a pulse signal, and the first circuit further comprises a transistor coupled to the second terminal of the switch and having a control terminal coupled to the pulse signal.

13. The circuit of claim 11, further comprising initialization circuitry for placing the counter in a predetermined state, the initialization circuitry including a first input coupled to a signal having a value indicative of a completion of a power-up operation and a second input coupled to a reset signal.

14. The circuit of claim 1, wherein the sequential logic circuit comprises a flip flop having a clock input coupled to an output of the second circuit.

15. A method for detecting, by a circuit, whether a switch has been closed, the switch including a first terminal coupled to at least one voltage source, each voltage source providing a distinct voltage level representative of a first logic level, and a second terminal, the method comprising:

temporarily driving the second terminal of the switch when open to a second logic level;

relatively weakly driving the second terminal of the switch to the second logic level following the step of temporarily driving;

sensing whether a voltage level appearing on the second terminal of the switch is driven by the at least one voltage source to a voltage level representative of the first logic level; and responsive to the step of sensing, generating an output signal having a value indicative of the second terminal of the switch being closed, and substantially eliminating static current drawn by the circuit when the second terminal of the switch is closed.

16. The method of claim 15, further comprises maintaining the output signal in a flip flop circuit.

17. The method of claim 15, wherein the step of temporarily driving comprises driving the second terminal of the switch to the second logic level for a predetermined period of time.

18. The method of claim 17, wherein the step of temporarily driving further comprises counting clock pulses to define the predetermined period of time.

19. The method of claim 15, wherein the step of temporarily driving comprises driving the second terminal of the switch to the second logic level upon completion of a power-up operation.

20. The method of claim 15, wherein the step of temporarily driving further comprises driving the second terminal of the switch to the second logic level upon initiation of a reset condition.

21. A circuit for detecting the state of a switch having a first terminal coupled to two or more voltage sources, each voltage source providing a distinct voltage level representing a logic high level, the circuit comprising:

first circuitry, having an output coupled to a second terminal of the switch for initially placing a first voltage on the second terminal of the switch in an open state representative of a logic low level; and second circuitry having an input coupled to the second terminal of the switch for sensing a voltage appearing on the second terminal the switch and an output for indicating whether the voltage appearing on the second terminal of the switch is at a voltage representative of the logic high level when the switch is in a closed state, the second circuitry being controlled to selectively eliminate static current drawn by the circuit when the switch is in a closed state based upon the value of the output of the second circuitry.

22. The circuit of claim 21, wherein the second circuitry comprises disable circuitry for selectively eliminating any static current path in the second circuitry.

23. The circuit of claim 22, wherein the second circuitry includes a first stage of transistors coupled to the switch, and the disable circuitry comprises at least one transistor in the first stage of transistors that is series connected with other transistors in the first stage of transistors.

24. The circuit of claim 23, further comprising third circuitry having an input coupled to the switch and an output coupled to a control terminal of the at least one transistor of the disable circuitry.

25. The circuit of claim 23, wherein the third circuitry comprises combination logic circuitry having a second input for receiving a reset signal.

26. The circuit of claim 23, wherein the combination logic circuitry includes a third input for receiving a signal to reset the circuit.

27. The circuit of claim 21, further comprising a sequential logic circuit coupled to the output of the second circuitry, for maintaining a value of the output signal.

28. The circuit of claim 23, wherein the first circuitry comprises a transistor coupled to the switch and a counter that is activated to count clock pulses appearing on a clock input signal, the counter generating a counter output signal that deactivates the transistor.

29. The circuit of claim 28, wherein the counter is activated to count clock pulses following the completion of a start-up operation.

* * * * *